United States Patent
Warner et al.

(10) Patent No.: US 12,396,126 B2
(45) Date of Patent: Aug. 19, 2025

(54) FAN BEHAVIOR ANOMALY DETECTION USING NEURAL NETWORK

(71) Applicant: Raytheon Company, Arlington, VA (US)

(72) Inventors: Eric Warner, Hudson, NH (US); Michael R. Salpukas, Lexington, MA (US); Arjang J. Noushin, Nashua, NH (US); Daniel J. Tipaldo, Arlington, MA (US); Daniel D. Sheahan, Somerville, MA (US)

(73) Assignee: Raytheon Company, Arlington, VA (US)

( * ) Notice: Subject to any disclaimer, the term of this patent is extended or adjusted under 35 U.S.C. 154(b) by 827 days.

(21) Appl. No.: 17/554,495

(22) Filed: Dec. 17, 2021

(65) Prior Publication Data
US 2023/0196088 A1 Jun. 22, 2023

(51) Int. Cl.
*H05K 7/20* (2006.01)
*G06N 3/08* (2023.01)

(52) U.S. Cl.
CPC ........... *H05K 7/20209* (2013.01); *G06N 3/08* (2013.01)

(58) Field of Classification Search
CPC .............................. H05K 7/20209; G06N 3/08
See application file for complete search history.

(56) References Cited

U.S. PATENT DOCUMENTS

| | | |
|---|---|---|
| 2019/0387646 A1 | 12/2019 | Yang |
| 2022/0319007 A1* | 10/2022 | Liu .................... A61B 6/06 |

FOREIGN PATENT DOCUMENTS

| | | |
|---|---|---|
| CN | 112648221 | 4/2021 |
| CN | 113236595 | 9/2021 |
| WO | 2023114483 | 6/2023 |

OTHER PUBLICATIONS

"International Application Serial No. PCT US2022 053194, International Search Report mailed May 2, 2023", 4 pgs.
"International Application Serial No. PCT US2022 053194, Written Opinion mailed May 2, 2023", 4 pgs.

* cited by examiner

*Primary Examiner* — Mark A Connolly
(74) *Attorney, Agent, or Firm* — Schwegman Lundberg & Woessner, P.A.

(57) ABSTRACT

Generally discussed herein are devices, systems, and methods for predicting fan failure. A method includes providing, to a first NN that models nominal behavior of a first fan and provides a value indicating a first amount of deviation from nominal as an output, first parameters of fan operation of the first fan, receiving, from the first NN and responsive to the first parameters, first data indicating the first amount of deviation from nominal, providing, to a second NN that models nominal behavior of a second fan and provides a value indicating a second amount of deviation from nominal as an output, second parameters of fan operation of the second fan, receiving, from the second NN and responsive to the first parameters, second data indicating the second amount of deviation from nominal, and estimating that the first or second fan has failed by comparing the first and second data.

20 Claims, 9 Drawing Sheets

FAN BEHAVIOR ANOMALY DETECTION USING NEURAL NETWORK

BACKGROUND

Commonly, time-series Neural Network predictors fall are either a Feed-Forward (FF) perceptron or some sort of Recurrent Neural Network (RNN). An FF perceptron retains a memory of only the most recent input point. An RNN attempts to remember all relevant input history. The FF perceptron does not allow for latent historical features to have an impact, and the RNN creates a heavyweight network that becomes computationally expensive in terms of memory overhead and compute bandwidth consumed.

Typically, FF neural networks (NNs) are optimized via a one-one relationship. Work has been done to optimize configuration of FF NN and RNNs Bishop, Christopher M. "Pattern recognition." Machine learning 128.9 (2006), Azoff, E. Michael, Neural network time series forecasting of financial markets. John Wiley & Sons, Inc., 1994, Mikolov, Tomas, et al. "Recurrent neural network based language model." Interspeech. Vol. 2. No, 3. 2010). Not much, if any, work has attempted to interpolate between the two techniques. Typically, in prognostics efforts, researchers have used RNNs or feed-forward NNs to predict Remaining Useful Life (MIL) of a component.

DETAILED DESCRIPTION

Embodiments provide an NN architecture that produces output that indicates when a fan will fail. A fan is a device that includes blades mechanically coupled to a motor. As the motor spins, the blades spin, moving air or other gas or debris in the vicinity of the fan.

Predicting when a fan will fail or otherwise has an issue that may affect the operation of the fan is an intractable task by classical physics-based modeling techniques. Embodiments provide physics-based parameters of the fan as input to an NN architecture and exploit the ability of the NN architecture to determine a proper model for the fan to overcome the intractable problem of classical physics-based modeling.

Not all physics parameters of fan operation are relevant to continued operation of the fan. Subject matter experts (SMEs) have identified that only a subset of fan physics parameters is relevant to determining whether a fan is operating properly. The SMEs have identified that a motor temperature is strongly correlated with fan performance. The NN presented uses these parameters, or values derived based on these parameters, as input. The NN provides an output that indicates how close the parameters are to nominal operation. Whether the fan is operating properly can be determine by comparing the output of multiple such NNs.

Figure 1:
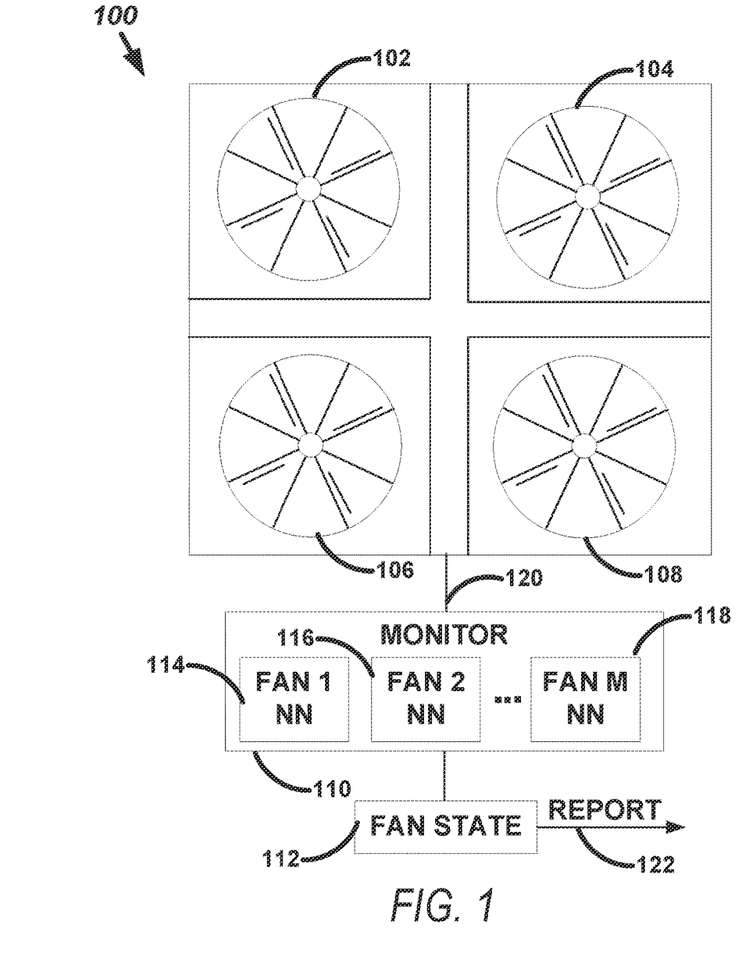
FIG. 1 illustrates, by way of example, a diagram of an embodiment of a fan system.

FIG. 1 illustrates, by way of example, a diagram of an embodiment of a fan system 100. The fan system 100 as illustrated includes multiple fans 102, 104, 106, 108, a fan monitor 110, and fan state module 112. The fans 102, 104, 106, 108 include blades and respective motors. The blades of a fan are mechanically coupled to the respective motor of the fan. The motor can rotate, causing the blades mechanically coupled thereto to rotate as well. The blade movement causes air circulation. The fan system 100 includes four fans 102, 104, 106, 108 but can include more fans or fewer fans, such as two or more fans. Further, the fans 102, 104, 106, 108 need not be in the same housing, one or more of the fans 102, 104, 106, 108 could be in different housings.

The monitor 110 includes software, firmware, hardware, or a combination thereof configured to monitor properties of the fan 102, 104, 106, 108. The monitor 110 receives messages 120 indicating physical properties of the fans 102, 104, 106, 108. The messages 120 can be fan specific or can include information for all fans 102, 104, 106, 108. The messages 120 can indicate a time (date and/or time the message is being sent), a number of rotations per unit time (e.g., rotations per minute (RPM), rotations per second (RPS), or other rotations per unit time), an ambient temperature (a temperature of air proximate the fan motor), a motor temperature (e.g., a winding temperature, or a temperature of another portion of the motor), a combination thereof, or the like. The messages 120 can include data indicating a fan 102, 104, 106, 108 associated with the data in the message. This way, the monitor 110 can manage data on a per fan 102, 104, 106, 108 basis.

The monitor 110 can operate on the data from the messages 120 and provide results of the operation to a corresponding fan NN 114, 116, 118, provide raw data from the messages 120 to a corresponding fan NN 114, 116, 118, or a combination thereof. The monitor 110 can implement a fan NN 114, 116, 118 for each fan 102, 104, 106, 108.

The fan NN 114, 116, 118 can be trained to determine how much the associated fan 102, 104, 106, 108 is deviating from nominal operation based on input thereto. The input can include results of operating on the data in the messages 120 or raw data from the messages 120. The fan NN 114, 116, 118 can provide a result that indicates an amount of "error" that indicates deviation from nominal operation. More details regarding the fan NN 114, 116, 118 are provided regarding FIG. 2 and elsewhere herein.

The fan state module 112 includes software, firmware, hardware, or a combination thereof configured to generate a report 122 of a state of the fan 102, 104, 106, 108. The report 122 can include data indicating the output of the NN 114, 116, 118, whether the fan 102, 104, 106, 108 is operating as expected or not, the data input to the NN 114, 116, 118 or a proper subset thereof, or the like. The report 122 can include a graphic depiction, a text rendering of the data, or the like. The report 122 can be provided as a text message, an electronic mail, a digital display on a user interface, a file stored in a repository, or the like.

The fan state module 112 can compare output from the fan NN 114, 116, 118 to determine whether the corresponding fan 102, 104, 106, 108 is operating properly. For example, if the fan NN 114 corresponding to the fan 102 provides an output that has increased since it was last provided and the fan NN 116 corresponding to the fan 104 provides an output with a similar increase (within a specified percentage, for example 5%, 10%, 15%, 20%, or a greater or lesser percentage as the fan NN 114), then the fan state module 112 can indicate that both the fans 102, 104 are operating properly. However, if the fan NN 114 corresponding to the fan 102 provides an output that has increased since it was last provided and the fan NN 116 corresponding to the fan 104 provides an output that does not have a similar increase, then the fan state module 112 can indicate that the fan 102 is not operating properly or otherwise might benefit from maintenance.

Figure 2:
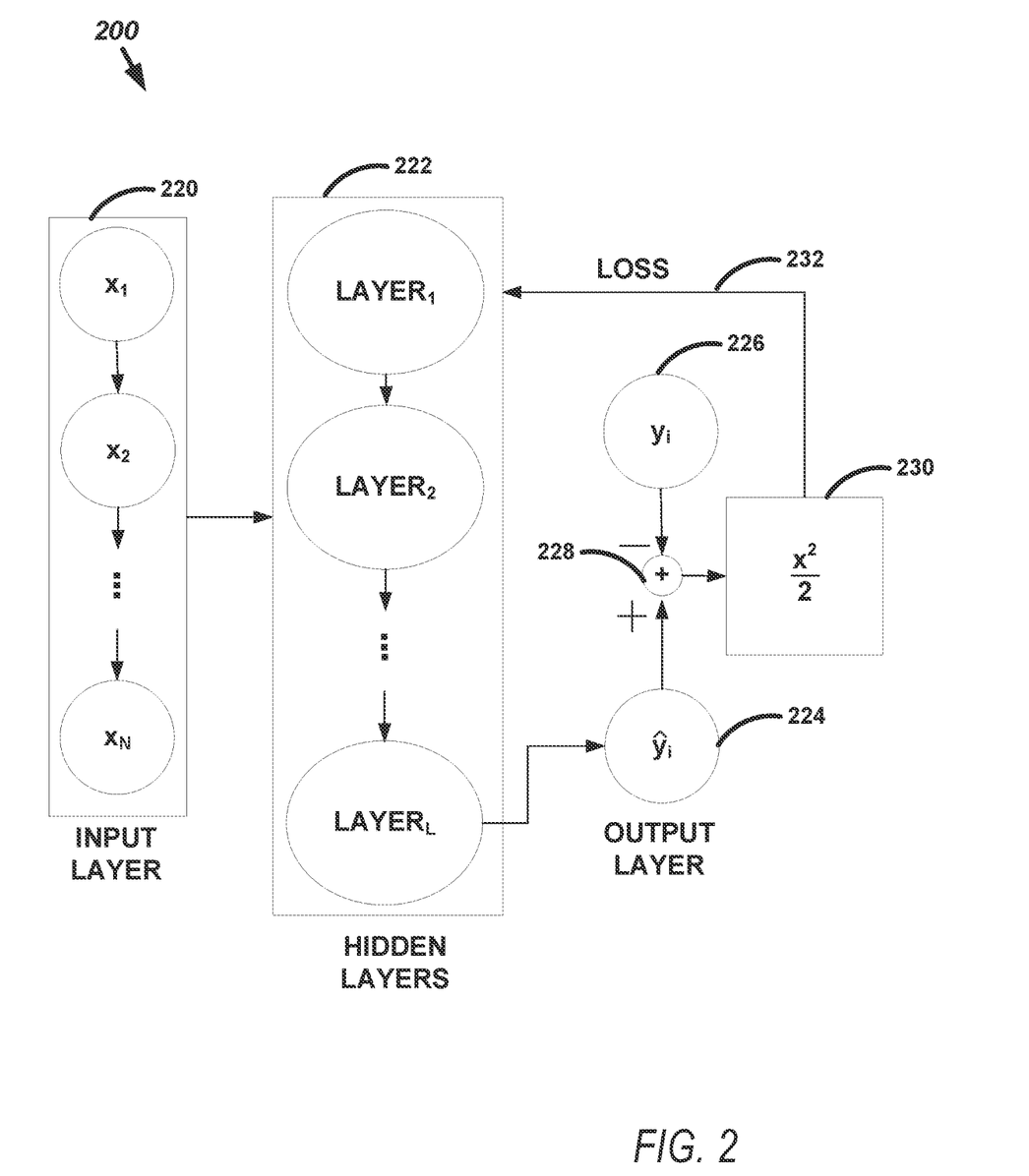
FIG. 2 illustrates, by way of example, a block diagram of an embodiment of a fan NN architecture.

FIG. 2 illustrates, by way of example, a block diagram of an embodiment of a fan NN architecture 200. The fan NN 114, 116, 118 can include the architecture of the fan NN architecture 200. The fan architecture 200 includes N inputs 220. The inputs 220 can include a change in time between immediately consecutive inputs (time as indicated by the messages 120) for the fan, the rotations per unit time, a difference between the rotation per unit time and an immediately previous rotations per unit time for that same fan, the ambient temperature, the motor temperature used to determine loss at an immediately prior time, or a combination thereof.

The efficiency of the fan 102, 104, 106, 108 is correlated with a motor temperature. The better controlled the motor temperature, the more efficiently the motor, and ultimately the fan 102, 104, 106, 108 is operating. The fan 102, 104, 106, 108 operation efficiency is correlated with whether the fan 102, 104, 106, 108 can benefit from maintenance or replacement. Thus, a fan 102, 104, 106, 108 that is operating inefficiently is more likely to benefit from maintenance or replacement.

The input 220, or the input 220 projected to an embedding space, can be provided to NN layers 222. The NN layers 222 can include a number of fully connected layers, such as L layers, an integer greater than, or equal to one (1). The NN layers 222 can provide a hidden layer vector to an output layer, such as a Softmax layer. The output layer can generate a prediction of the motor temperature 224 based on the hidden layer vector. The predicted motor temperature 224 can be used, along with the motor temperature 226 from the messages 120, to determine a loss 232. The loss 232, in the example of FIG. 2 is a sum of the difference between the predicted motor temperature 224, and the motor temperature 226, squared and then divided by two (2). In mathematical form this is represented as $\Sigma_{i=1}^{N}(\gamma_i-\gamma_t)^2/2)$. The loss 232 can be backpropagated to further train the NN architecture 200 in some embodiments. The loss 232 in the example of FIG. 2 is a combination of the adder 228 and square and divide by two (2) module 230.

To train the NN architecture 200, historic data of nominal fan operation can be provided as training examples. That is, known, nominal data for the fan 102, 104, 106, 108 can be used to train the NN 114, 116, 118 to model the corresponding fan 102, 104, 106, 108 operation. Then, in operation, the loss 232 can be foregone and the loss 232 can be provided as an error in the fan 102, 104, 106, 108.

Figure 3:
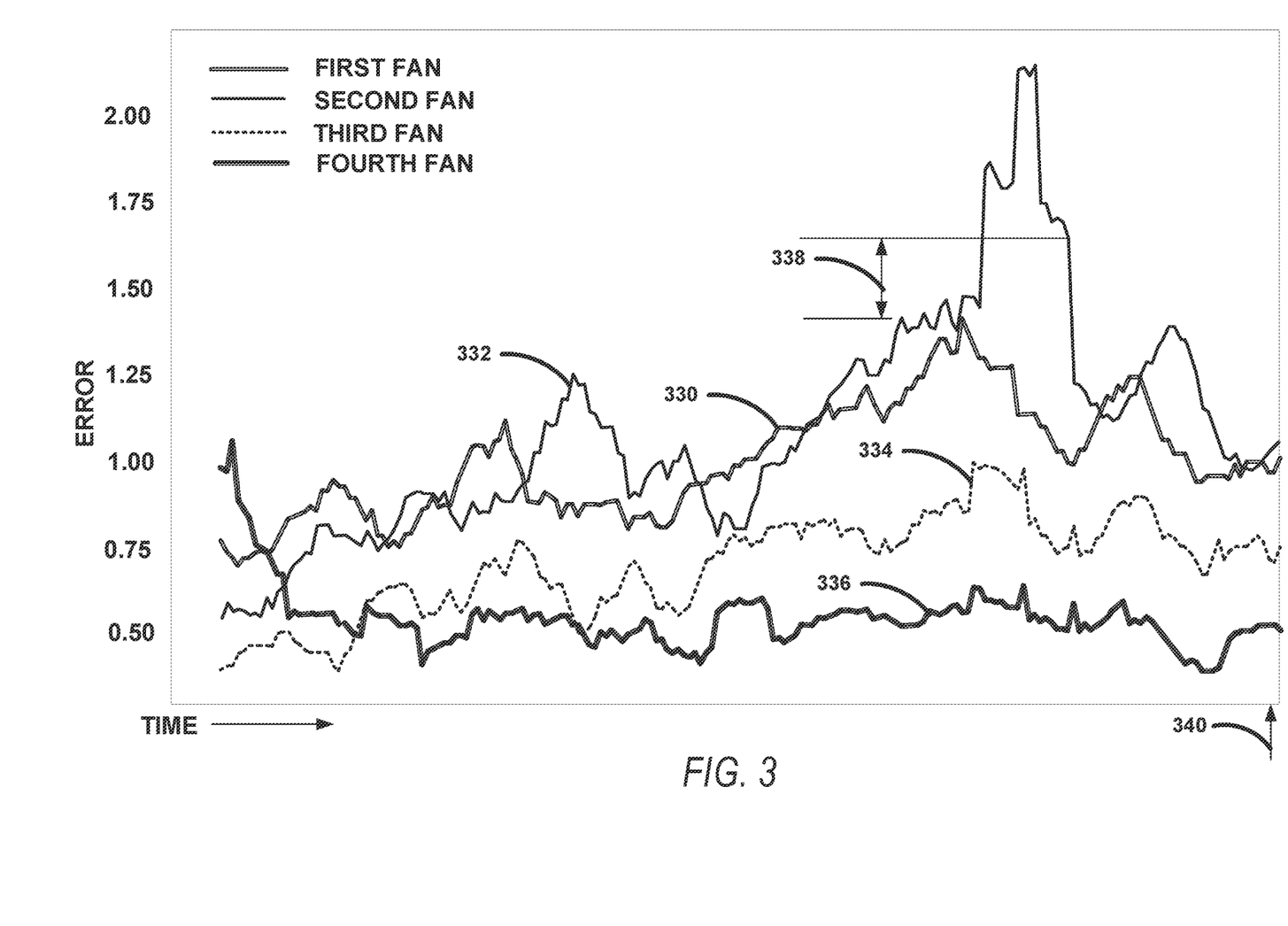
FIG. 3 illustrates, by way of example, a graph of NN output (labelled as error) versus time for example fans.

FIG. 3 illustrates, by way of example, a graph of NN output (labelled as error) versus time for example fans. The graph of FIG. 3 shows a divergence in error between the second fan (indicated by line 332) and the errors of the remaining fans (indicated by lines 330, 334, 336). The divergence in error (indicated by arrow 338) indicates a pending failure in the second fan. In the example of the fans illustrated, the second fan failed at about a time indicated by arrow 340. FIG. 3 indicates the viability of the NN architecture 200 to detect pending fan failure.

Note how, in FIG. 3, the lines 330, 334, 336 move generally synchronous with one another. This indicates that the fans associated with the lines 330, 334, 336 are operating as expected even though the fan corresponding to the line 330 was scheduled to be replaced along with the fan corresponding to the line 332. When the error reported by the NN diverges from error reported from other NNs, according to a criterion (e.g., correlation of change in output from the NN relative to the other NNs for a specified time being less than a specified threshold, a change in output more than a percentage greater than change in output for one or more other NNs, or the like), the corresponding fan 102, 104, 106, 108 can be indicated as a candidate for maintenance or replacement.

Figure 4:
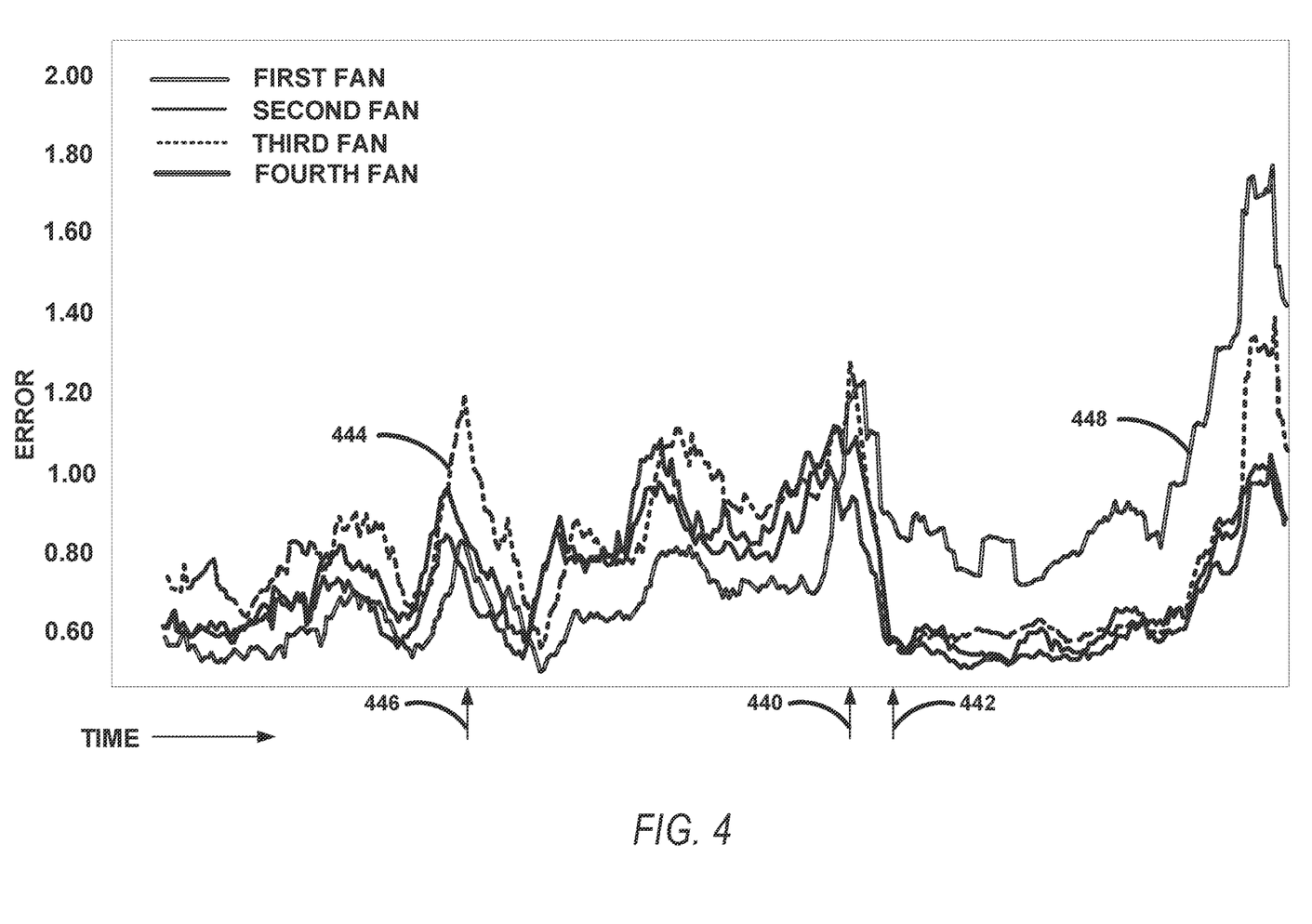
FIG. 4 illustrates, by way of example, another graph of NN output (labelled as error) versus time for example fans.

FIG. 4 illustrates, by way of example, another graph of NN output (labelled as error) versus time for example fans. Arrow 440 indicates when the third fan fails and arrow 442 indicates when the first fan fails. The failure of the third fan can be indicated by the abnormally large spike in line 444 at about the time corresponding to arrow 446. The failure of the first fan can be indicated by the abnormally large change in the error indicated by line 448 around the time indicated by the arrow 440. The continued increase in error indicated by 448 after the time indicated by arrow 442 can further indicate fan failure. The replacement fan for line 448 failed at the end of the timeframe illustrated in FIG. 4.

Figure 5:
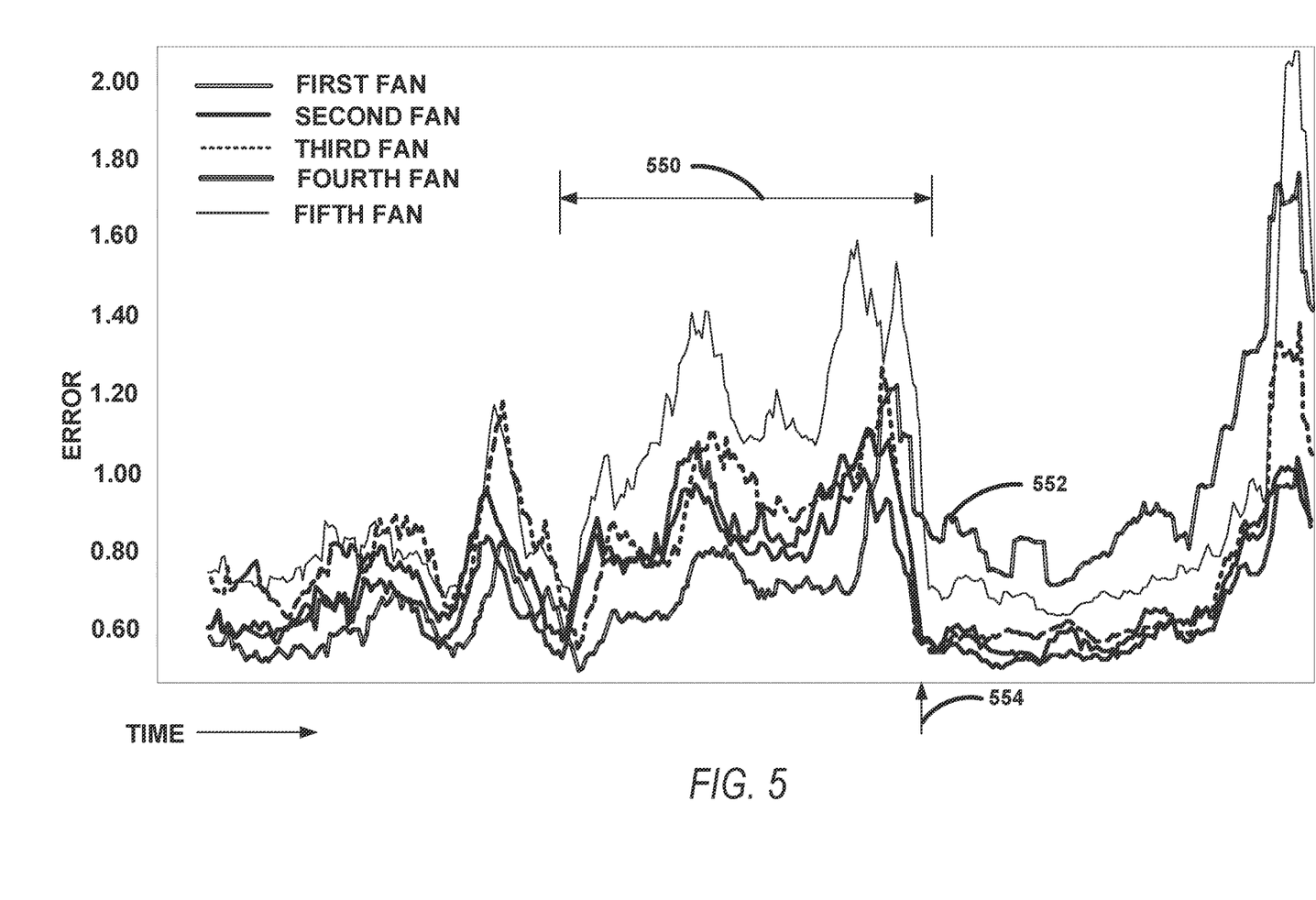
FIG. 5 illustrates, by way of example, another graph of NN output (labelled as error) versus time for example fans.

FIG. 5 illustrates, by way of example, another graph of NN output (labelled as error) versus time for example fans. Since the NNs 114, 116, 118 are trained to model an individual fan 102, 104, 106, 108 an increase in error can indicate an error in setup. In the example of FIG. 5, a fan controller was mis-wired to switch two fans in the time indicated by arrow 550. An abnormally large error can thus be indicative of an error in setup, pending failure, or previous failure. An increase in error for the first fan (indicated by line 552) at about the time corresponding to arrow 554 indicates a potential issue with the first fan. The first fan, in this case, failed about the time indicated by arrow 554.

Figure 6:
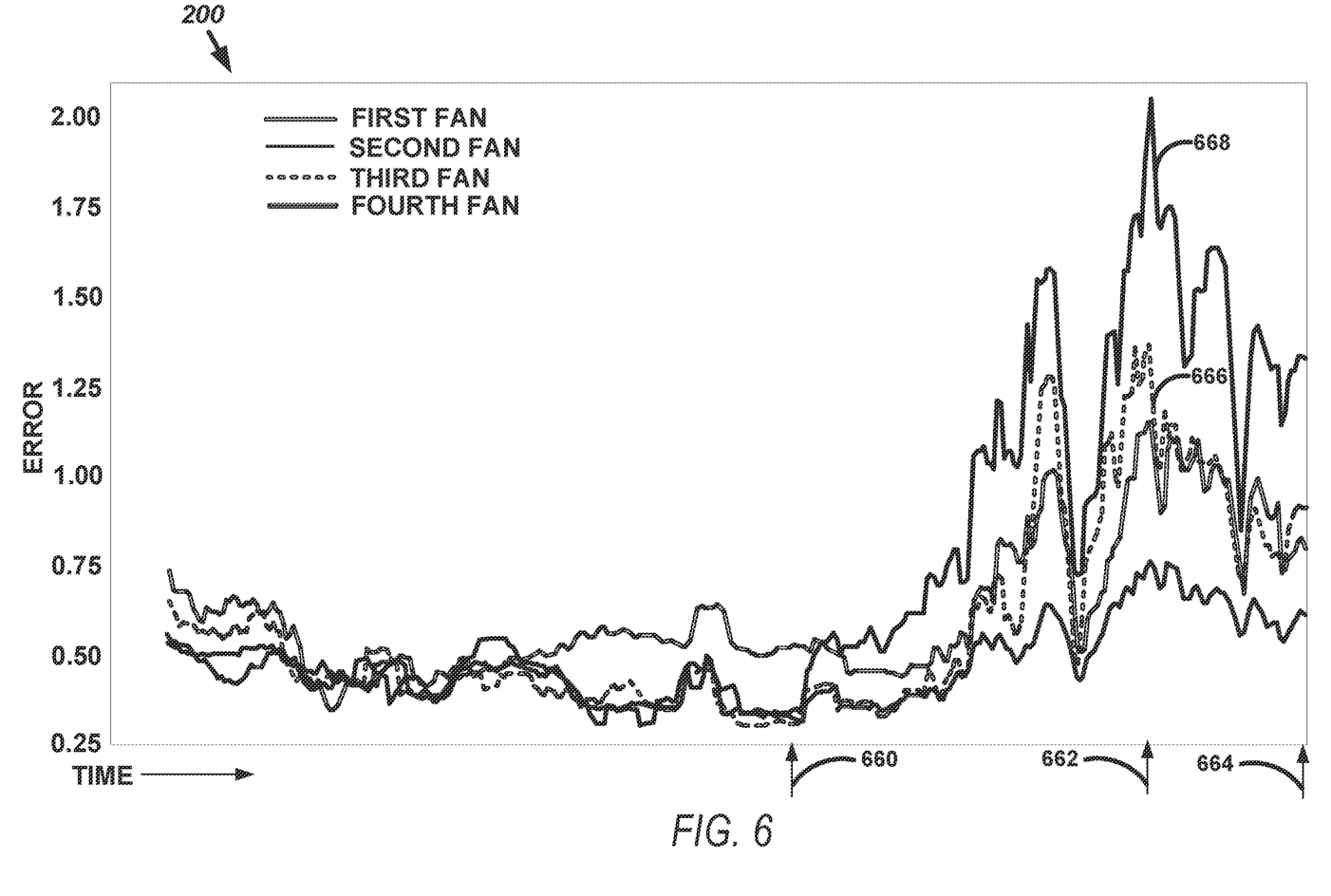
FIG. 6 illustrates, by way of example, another graph of NN output (labelled as error) versus time for example fans.

FIG. 6 illustrates, by way of example, another graph of NN output (labelled as error) versus time for example fans. Since the error of the fans can be compared relative to one another to identify a potential issue, the NNs 114, 116, 118 can remain accurate even after the fans are upgraded (similar changes are made to each of the fans 102, 104, 106, 108). The fans associated with FIG. 6 were upgraded at a time indicated by arrow 660. The third fan failed at a time indicated by arrow 662. The failure of the third fan can be detected by abnormally large spikes in line 666 experienced prior to failure at the time indicated by arrow 662. The second fan failed at a time indicated by arrow 664. The failure of the second fan, similarly, can be detected by detecting the abnormally large spikes in the line 668 prior to failure at the time indicated by arrow 664.

Figure 7:
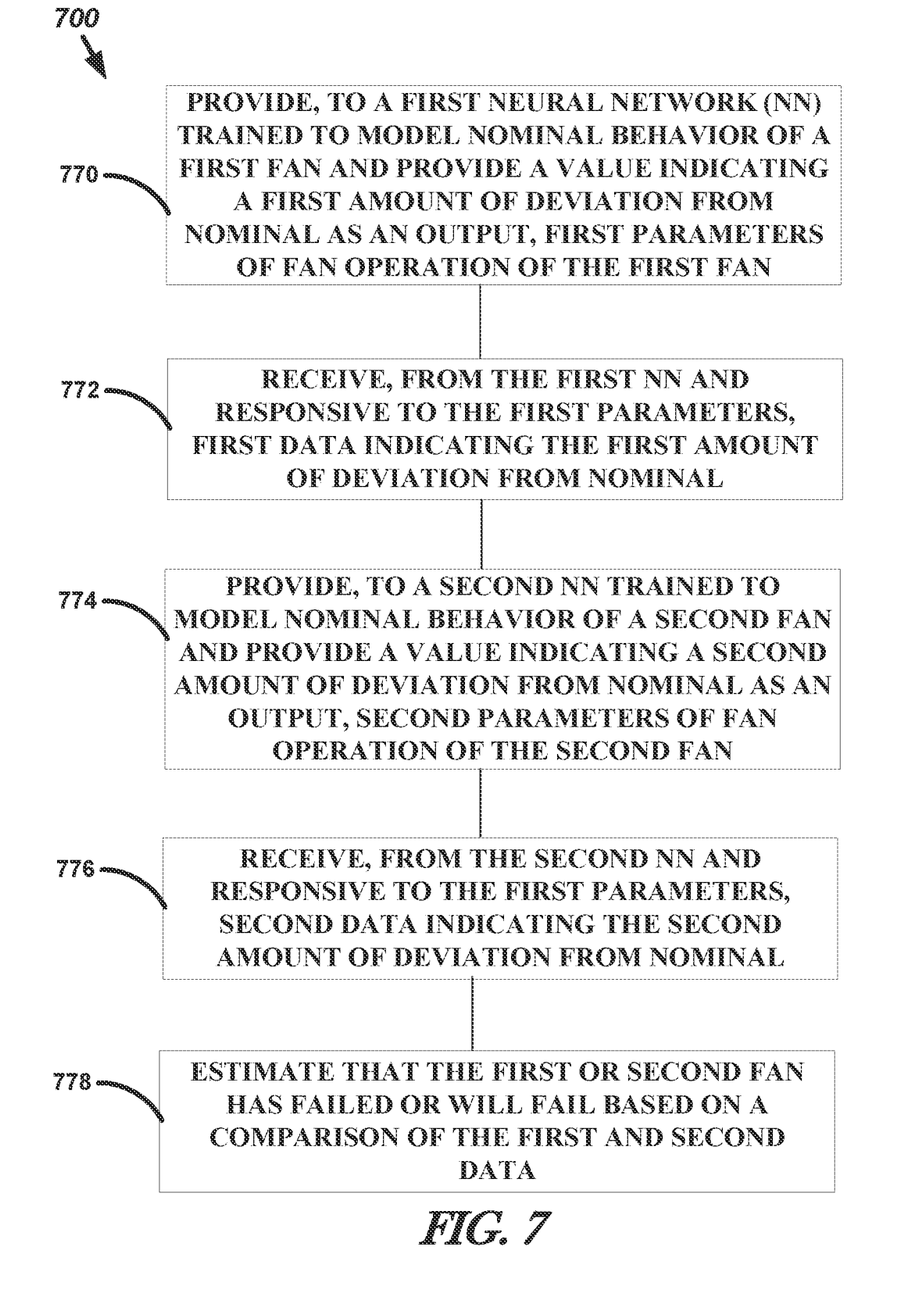
FIG. 7 illustrates, by way of example, a block diagram of an embodiment of a method for fan problem prediction or detection.

FIG. 7 illustrates, by way of example, a block diagram of an embodiment of a method 700 for fan problem prediction or detection. The method 700 as illustrated includes providing, to a first neural network (NN) trained to model nominal behavior of a first fan and provide a value indicating a first amount of deviation from nominal as an output, first parameters of fan operation of the first fan, at operation 770;

receiving, from the first NN and responsive to the first parameters, first data indicating the first amount of deviation from nominal, at operation 772; providing, to a second NN trained to model nominal behavior of a second fan and provide a value indicating a second amount of deviation from nominal as an output, second parameters of fan operation of the second fan, at operation 776; receiving, from the second NN and responsive to the first parameters, second data indicating the second amount of deviation from nominal, at operation 776; and estimating that the first or second fan has failed or will fail based on a comparison of the first and second data, at operation 778.

The method 700 can further include receiving, from a fan system including the first and second fans, a message, and deriving the first and second parameters based on data in the message. The method 700 can further include, wherein the data in the message includes two or more of time, ambient temperature about a corresponding fan, motor temperature of a motor of the corresponding fan, and rotations per unit time of the motor of the corresponding fan. The method 700 can further include, wherein deriving the first and second parameters includes determining a time difference between the message and a second time in an immediately previous message and providing the time difference as one of the first or second parameters.

The method 700 can further include, wherein deriving the first and second parameters includes determining a difference between the rotations per unit time and a second rotations per unit time in an immediately previous message resulting in a different in rotations and providing the rotations per unit time and the difference in rotations as one of the first or second parameters. The method 700 can further include, wherein deriving the first and second parameters include providing the ambient temperature from the message and a motor temperature from an immediately previous message as parameters of the first or second parameters. The method 700 can further include, wherein the output of the first and second NNs is an estimate of a motor temperature of the respective fan and the first and second deviation from nominal are determined based on a corresponding motor temperature from the message and the estimate of the motor temperature.

Hardware includes electric or electronic component arranged to perform operations of the component. Example components include the monitor 110, the fan state module 112, among others. Electric or electronic components include resistors, transistors, capacitors, inductors, diodes, amplifiers, oscillators, switches, logic gates (e.g., AND, OR, XOR, negate, buffer, or the like), processing units (e.g., central processing units (CPUs), application specific integrated circuits (ASICs), field programmable gate arrays (FPGAs), graphics processing units (GPUs), or the like), multiplexers, memory devices, power supplies, analog to digital converters, digital to analog converters, a combination thereof, or the like.

Artificial intelligence (AI) is a field concerned with developing decision-making systems to perform cognitive tasks that have traditionally required a living actor, such as a person. Neural networks (NNs) are computational structures that are loosely modeled on biological neurons. Generally, NNs encode information (e.g., data or decision making) via weighted connections (e.g., synapses) between nodes (e.g., neurons). Modern NNs are foundational to many AI applications, such as speech recognition.

Many NNs are represented as matrices of weights that correspond to the modeled connections. NNs operate by accepting data into a set of input neurons that often have many outgoing connections to other neurons. At each traversal between neurons, the corresponding weight modifies the input and is tested against a threshold at the destination neuron. If the weighted value exceeds the threshold, the value is again weighted, or transformed through a nonlinear function, and transmitted to another neuron further down the NN graph—if the threshold is not exceeded then, generally, the value is not transmitted to a down-graph neuron and the synaptic connection remains inactive. The process of weighting and testing continues until an output neuron is reached; the pattern and values of the output neurons constituting the result of the NN processing.

The correct operation of most NNs relies on accurate weights. However, NN designers do not generally know which weights will work for a given application. NN designers typically choose a number of neuron layers or specific connections between layers including circular connections. A training process may, be used to determine appropriate weights by selecting initial weights. In some examples, the initial weights may be randomly selected. Training data is fed into the NN and results are compared to an objective function that provides an indication of error. The error indication is a measure of how wrong the NN's result is compared to an expected result. This error is then used to correct the weights. Over many iterations, the weights will collectively converge to encode the operational data into the NN. This process may be called an optimization of the objective function (e.g., a cost or loss function), whereby the cost or loss is minimized.

A gradient descent technique is often used to perform the objective function optimization. A gradient (e.g., partial derivative) is computed with respect to layer parameters (e.g., aspects of the weight) to provide a direction, and possibly a degree, of correction, but does not result in a single correction to set the weight to a "correct" value. That is, via several iterations, the weight will move towards the "correct," or operationally useful, value. In some implementations, the amount, or step size, of movement is fixed (e.g., the same from iteration to iteration). Small step sizes tend to take a long time to converge, whereas large step sizes may oscillate around the correct value or exhibit other undesirable behavior. Variable step sizes may be attempted to provide faster convergence without the downsides of large step sizes.

Backpropagation is a technique whereby training data is fed forward through the NN—here "forward" means that the data starts at the input neurons and follows the directed graph of neuron connections until the output neurons are reached—and the objective function is applied backwards through the NN to correct the synapse weights. At each step in the backpropagation process, the result of the previous step is used to correct a weight. Thus, the result of the output neuron correction is applied to a neuron that connects to the output neuron, and so forth until the input neurons are reached. Backpropagation has become a popular technique to train a variety of NNs. Any well-known optimization algorithm for back propagation may be used, such as stochastic gradient descent (SGD), Adam, etc.

Figure 8:
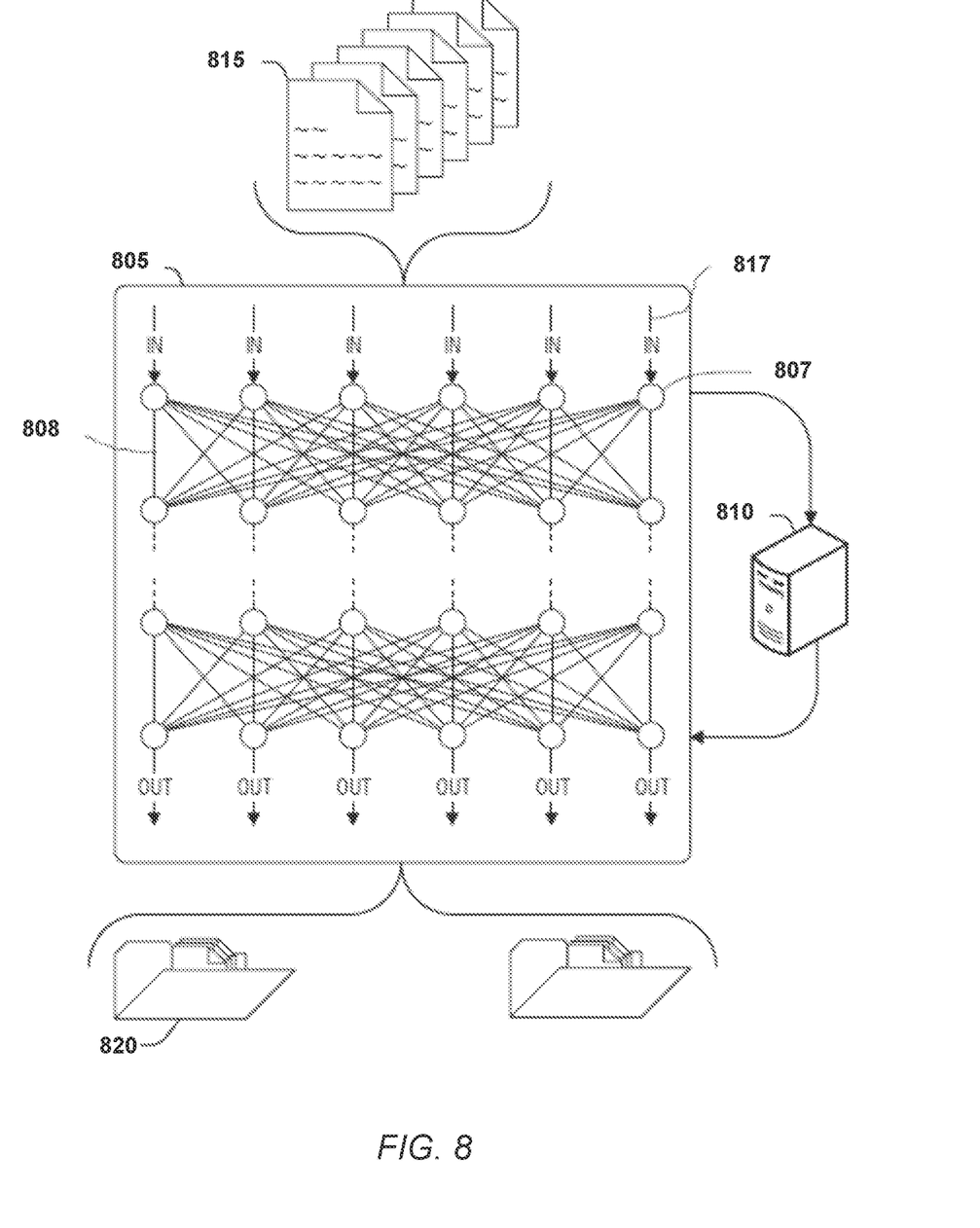
FIG. 8 is a block diagram of an example of an environment including a system for neural network training, according to an embodiment.

FIG. 8 is a block diagram of an example of an environment including a system for neural network training, according to an embodiment. The system can aid in training of an NN model that models nominal behavior of a fan 102, 104, 106, 108 and provides an output indicating divergence from nominal. The system includes an artificial NN (ANN) 805 that is trained using a processing node 810. The processing node 810 may be a central processing unit (CPU), graphics processing unit (GPU), field programmable gate array (FPGA), digital signal processor (DSP), application specific integrated circuit (ASIC), or other processing circuitry. In an example, multiple processing nodes may be employed to train different layers of the ANN 805, or even different nodes 807 within layers. Thus, a set of processing nodes 810 is arranged to perform the training of the ANN 805.

The set of processing nodes 810 is arranged to receive a training set 815 for the ANN 805. The ANN 805 comprises a set of nodes 807 arranged in layers (illustrated as rows of nodes 807) and a set of inter-node weights 808 (e.g., parameters) between nodes in the set of nodes. In an example, the training set 815 is a subset of a complete training set. Here, the subset may enable processing nodes with limited storage resources to participate in training the ANN 805.

The training data may include multiple numerical values representative of a domain, such as a word, symbol, other part of speech, a cell of a notebook, or the like. Each value of the training or input 817 to be classified after ANN 805 is trained, is provided to a corresponding node 807 in the first layer or input layer of ANN 805. The values propagate through the layers and are changed by the objective function.

As noted, the set of processing nodes is arranged to train the neural network to create a trained neural network. After the ANN is trained, data input into the ANN will produce valid classifications 820 (e.g., the input data 817 will be assigned into categories), for example. The training performed by the set of processing nodes 807 is iterative. In an example, each iteration of the training the ANN 805 is performed independently between layers of the ANN 805, Thus, two distinct layers may be processed in parallel by different members of the set of processing nodes. In an example, different layers of the ANN 805 are trained on different hardware. The members of different members of the set of processing nodes may be located in different packages, housings, computers, cloud-based resources, etc. In an example, each iteration of the training is performed independently between nodes in the set of nodes. This example is an additional parallelization whereby individual nodes 807 (e.g., neurons) are trained independently. In an example, the nodes are trained on different hardware.

Figure 9:
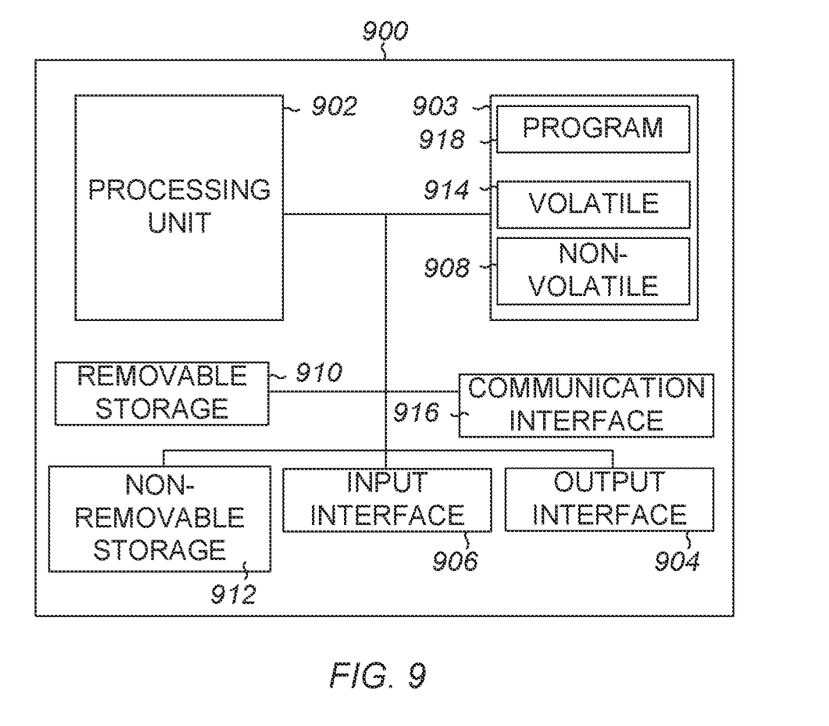
FIG. 9 illustrates, by way of example, a block diagram of an embodiment of a machine (e.g., a computer system) to implement one or more embodiments.

FIG. 9 illustrates, by way of example, a block diagram of an embodiment of a machine 900 (e.g., a computer system) to implement one or more embodiments. The machine 900, a portion thereof, the system 100, or a portion thereof, or a combination thereof, can implement the method 700. The monitor 110, NN 114, 116, 118, fan state module 112, architecture 200, or a portion or a component thereof can include one or more of the components of the machine 900. One or more of the method 700, monitor 110, NN 114, 116, 118, fan state module 112, architecture 200, or a component or operations thereof can be implemented, at least in part, using a component of the machine 900. One example machine 900 (in the form of a computer), may include a processing unit 902, memory 903, removable storage 910, and non-removable storage 912. Although the example computing device is illustrated and described as machine 900, the computing device may be in different forms in different embodiments. For example, the computing device may instead be a smartphone, a tablet, smartwatch, or other computing device including the same or similar elements as illustrated and described regarding FIG. 9. Devices such as smartphones, tablets, and smartwatches are generally collectively referred to as mobile devices. Further, although the various data storage elements are illustrated as part of the machine 900, the storage may also or alternatively include cloud-based storage accessible via a network, such as the Internet.

Memory 903 may include volatile memory 914 and non-volatile memory 908. The machine 900 may include or have access to a computing environment that includes—a variety of computer-readable media, such as volatile memory 914 and non-volatile memory 908, removable storage 910 and non-removable storage 912. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices capable of storing computer-readable instructions for execution to perform functions described herein.

The machine 900 may include or have access to a computing environment that includes input 906, output 904, and a communication connection 916. Output 904 may include a display device, such as a touchscreen, that also may serve as an input device. The input 906 may include one or more of a touchscreen, touchpad, mouse, keyboard, camera, one or more device-specific buttons, one or more sensors integrated within or coupled via wired or wireless data connections to the machine 900, and other input devices. The computer may operate in a networked environment using a communication connection to connect to one or more remote computers, such as database servers, including cloud-based servers and storage. The remote computer may include a personal computer (PC), server, router, network PC, a peer device or other common network node, or the like. The communication connection may include a Local Area Network (LAN), a Wide Area Network (WAN), cellular, Institute of Electrical and Electronics Engineers (IEEE) 80211 (Wi-Fi), Bluetooth, or other networks.

Computer-readable instructions stored on a computer-readable storage device are executable by the processing unit 902 (sometimes called processing circuitry) of the machine 900. A hard drive, CD-ROM, and RAM are some examples of articles including a non-transitory computer-readable medium such as a storage device. For example, a computer program 918 may be used to cause processing unit 902 to perform one or more methods or algorithms described herein.

The operations, functions, or algorithms, such as the loss block or the embedding block, or other block described herein may be implemented in software, hardware, or firmware, or a combination thereof in some embodiments. The software may include computer executable instructions stored on computer or other machine-readable media or storage device, such as one or more non-transitory memories (e.g., a non-transitory machine-readable medium) or other type of hardware-based storage devices, either local or networked. Further, such functions may correspond to subsystems, which may be software, hardware, firmware, or a combination thereof. Multiple functions may be performed in one or more subsystems as desired, and the embodiments described are merely examples. The software may be executed on a digital signal processor, ASIC, microprocessor, central processing unit (CPU), graphics processing unit (GPU), field programmable gate array (FPGA), or other type of processor operating on a computer system, such as a personal computer, server, or other computer system, turning such computer system into a specifically programmed machine. The functions or algorithms may be implemented using processing circuitry, such as may include electric and/or electronic components (e.g., one or more transistors, resistors, capacitors, inductors, amplifiers, modulators, demodulators, antennas, radios, regulators, diodes, oscillators, multiplexers, logic gates, buffers, caches, memories, GPUs, CPUs, field programmable gate arrays (FPGAs), or the like).

Additional Notes and Examples

Example 1 can include a method comprising providing, to a first neural network (NN) trained to model nominal behavior of a first fan and provide a value indicating a first amount of deviation from nominal as an output, first parameters of fan operation of the first fan, receiving, from the first NN and responsive to the first parameters, first data indicating the first amount of deviation from nominal, providing, to a second NN trained to model nominal behavior of a second fan and provide a value indicating a second amount of deviation from nominal as an output, second parameters of fan operation of the second fan, receiving, from the second NN and responsive to the first parameters, second data indicating the second amount of deviation from nominal, and estimating that the first or second fan has failed or will fail based on a comparison of the first and second data.

In Example 2, Example 1 can further include receiving, from a fan system including the first and second fans, a message, and deriving the first and second parameters based on data in the message.

In Example 3, Example 2 can further include, wherein the data in the message includes two or more of time, ambient temperature about a corresponding fan, motor temperature of a motor of the corresponding fan, and rotations per unit time of the motor of the corresponding fan.

In Example 4, Example 3 can further include, wherein deriving the first and second parameters includes determining a time difference between the message and a second time in an immediately previous message and providing the time difference as one of the first or second parameters.

In Example 5, at least one of Examples 3-4 can further include, wherein deriving the first and second parameters includes determining a difference between the rotations per unit time and a second rotations per unit time in an immediately previous message resulting in a different in rotations and providing the rotations per unit time and the difference in rotations as one of the first or second parameters.

In Example 6, at least one of Examples 3-5 can further include, wherein deriving the first and second parameters include providing the ambient temperature from the message and a motor temperature from an immediately previous message as parameters of the first or second parameters.

In Example 7, at least one of Examples 3-6 can further include, wherein the output of the first and second NNs is an estimate of a motor temperature of the respective fan and the first and second deviation from nominal are determined based on a corresponding motor temperature from the message and the estimate of the motor temperature.

Example 8 includes a non-transitory machine-readable medium including instructions that, when executed by a machine, cause the machine to perform operations comprising the method of one of Examples 1-7.

Example 9 includes a system comprising processing circuitry and a memory coupled to the processing circuitry, the memory including instructions that, when executed by the processing circuitry, cause the processing circuitry to perform operations comprising the method of one of Examples 1-7.

Although a few embodiments have been described in detail above, other modifications are possible. For example, the logic flows depicted in the figures do not require the order shown, or sequential order, to achieve desirable results. Other steps may be provided, or steps may be eliminated, from the described flows, and other components may be added to, or removed from, the described systems. Other embodiments may be within the scope of the following claims.

What is claimed is:

1. A method comprising:
providing, to a first neural network (NN) trained to model nominal behavior of a first fan and provide a value indicating a first amount of deviation from nominal as an output, first parameters of fan operation of the first fan;
receiving, from the first NN and responsive to the first parameters, first data indicating the first amount of deviation from nominal;
providing, to a second NN trained to model nominal behavior of a second fan and provide a value indicating a second amount of deviation from nominal as an output, second parameters of fan operation of the second fan;
receiving, from the second MN and responsive to the first parameters, second data indicating the second amount of deviation from nominal; and
estimating that the first or second fan has failed or will fail based on a comparison of the first and second data.

2. The method of claim 1, further comprising:
receiving, from a fan system including the first and second fans, a message; and
deriving the first and second parameters based on data in the message.

3. The method of claim 2, wherein the data in the message includes two or more of time, ambient temperature about a corresponding fan, motor temperature of a motor of the corresponding fan, and rotations per unit time of the motor of the corresponding fan.

4. The method of claim 3, wherein deriving the first and second parameters includes determining a time difference between the message and a second time in an immediately previous message and providing the time difference as one of the first or second parameters.

5. The method of claim 3, wherein deriving the first and second parameters includes determining a difference between the rotations per unit time and a second rotations per unit time in an immediately previous message resulting in a different in rotations and providing the rotations per unit time and the difference in rotations as one of the first or second parameters.

6. The method of claim 3, wherein deriving the first and second parameters include providing the ambient temperature from the message and a motor temperature from an immediately previous message as parameters of the first or second parameters.

7. The method of claim 3, wherein the output of the first and second NNs is an estimate of a motor temperature of the respective fan and the first and second deviation from nominal are determined based on a corresponding motor temperature from the message and the estimate of the motor temperature.

8. A non-transitory machine-readable medium including instructions that, when executed by a machine, cause the machine to perform operations comprising:
- providing, to a first neural network (NN) trained to model nominal behavior of a first fan and provide a value indicating a first amount of deviation from nominal as an output, first parameters of fan operation of the first fan;
- receiving, from the first NN and responsive to the first parameters, first data indicating the first amount of deviation from nominal;
- providing, to a second NN trained to model nominal behavior of a second fan and provide a value indicating a second amount of deviation from nominal as an output, second parameters of fan operation of the second fan;
- receiving, from the second NN and responsive to the first parameters, second data indicating the second amount of deviation from nominal; and
- estimating that the first or second fan has failed or will fail based on a comparison of the first and second data.

9. The non-transitory machine-readable medium of claim 8, wherein the operations further comprise:
- receiving, from a fan system including the first and second fans, a message; and
- deriving the first and second parameters based on data in the message.

10. The non-transitory machine-readable medium of claim 9, wherein the data in the message includes two or more of time, ambient temperature about a corresponding fan, motor temperature of a motor of the corresponding fan, and rotations per unit time of the motor of the corresponding fan.

11. The non-transitory machine-readable medium of claim 10, wherein deriving the first and second parameters includes determining a time difference between the message and a second time in an immediately previous message and providing the time difference as one of the first or second parameters.

12. The non-transitory machine-readable medium of claim 10, wherein deriving the first and second parameters includes determining a difference between the rotations per unit time and a second rotations per unit time in an immediately previous message resulting in a different in rotations and providing the rotations per unit time and the difference in rotations as one of the first or second parameters.

13. The non-transitory machine-readable medium of claim 10, wherein deriving the first and second parameters include providing the ambient temperature from the message and a motor temperature from an immediately previous message as parameters of the first or second parameters.

14. The non-transitory machine-readable medium of claim 10, wherein the output of the first and second NNs is an estimate of a motor temperature of the respective fan and the first and second deviation from nominal are determined based on a corresponding motor temperature from the message and the estimate of the motor temperature.

15. A system comprising:
- processing circuitry;
- a memory coupled to the processing circuitry, the memory including instructions that, when executed by the processing circuitry, cause the processing circuitry to perform operations comprising:
  - providing, to a first neural network (NN) trained to model nominal behavior of a first fan and provide a value indicating a first amount of deviation from nominal as an output, first parameters of fan operation of the first fan;
  - receiving, from the first NN and responsive to the first parameters, first data indicating the first amount of deviation from nominal;
  - providing, to a second NN trained to model nominal behavior of a second fan and provide a value indicating a second amount of deviation from nominal as an output, second parameters of fan operation of the second fan;
  - receiving, from the second NN and responsive to the first parameters, second data indicating the second amount of deviation from nominal; and
  - estimating that the first or second fan has failed or will fail based on a comparison of the first and second data.

16. The system of claim 15, wherein the operations further comprise:
- receiving, from a fan system including the first and second fans, a message; and
- deriving the first and second parameters based on data in the message.

17. The system of claim 16, wherein the data in the message includes two or more of time, ambient temperature about a corresponding fan, motor temperature of a motor of the corresponding fan, and rotations per unit time of the motor of the corresponding fan.

18. The system of claim 17, wherein deriving the first and second parameters includes determining a time difference between the message and a second time in an immediately previous message and providing the time difference as one of the first or second parameters.

19. The system of claim 17, wherein deriving the first and second parameters includes determining a difference between the rotations per unit time and a second rotations per unit time in an immediately previous message resulting in a different in rotations and providing the rotations per unit time and the difference in rotations as one of the first or second parameters.

20. The system of claim 17, wherein deriving the first and second parameters include providing the ambient temperature from the message and a motor temperature from an immediately previous message as parameters of the first or second parameters.

* * * * *